United States Patent
Efland et al.

(10) Patent No.: US 7,142,139 B2
(45) Date of Patent: *Nov. 28, 2006

(54) POWERING DOWN OF DAC AND ADC FOR RECEIVE/TRANSMIT MODES OF OPERATION IN A WIRELESS DEVICE

(75) Inventors: Gregory H. Efland, Palo Alto, CA (US); Venkat Kodavati, San Jose, CA (US); Gouri Pidugu, Cupertino, CA (US); Srinivasa H. Garlapati, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/221,341

(22) Filed: Sep. 6, 2005

(65) Prior Publication Data

US 2006/0007030 A1  Jan. 12, 2006

Related U.S. Application Data

(63) Continuation of application No. 10/847,798, filed on May 18, 2004, now Pat. No. 7,079,058.

(51) Int. Cl.
*H03M 1/00* (2006.01)
(52) U.S. Cl. .................. 341/126; 341/144; 341/110; 341/155
(58) Field of Classification Search ............... 341/126, 341/155, 141, 110, 144; 455/434, 454, 73; 375/207, 343; 358/1.15
See application file for complete search history.

(56) References Cited

U.S. PATENT DOCUMENTS

| | | | |
|---|---|---|---|
| 5,524,185 A * | 6/1996 | Na | 358/1.15 |
| 5,714,955 A | 2/1998 | Reay et al. | |
| 5,722,040 A * | 2/1998 | Bjerede et al. | 455/76 |
| 5,950,131 A | 9/1999 | Vilmur | |
| 6,167,099 A * | 12/2000 | Rader et al. | 375/347 |
| 6,233,431 B1 | 5/2001 | Panther et al. | |
| 6,411,330 B1 | 6/2002 | Purcell et al. | |
| 6,642,879 B1 | 11/2003 | Amar et al. | |
| 6,661,360 B1 | 12/2003 | Lambert | |
| 6,681,332 B1 | 1/2004 | Byrne et al. | |
| 6,775,531 B1 * | 8/2004 | Kaewell et al. | 455/343.1 |
| 6,804,308 B1 | 10/2004 | Claxton et al. | |
| 6,882,851 B1 * | 4/2005 | Sugar et al. | 455/454 |
| 6,882,861 B1 | 4/2005 | Panasik et al. | |
| 7,035,595 B1 * | 4/2006 | Kim et al. | 455/73 |

* cited by examiner

Primary Examiner—Jean Bruner Jeanglaude
(74) Attorney, Agent, or Firm—Garlick Harrison & Markison

(57) ABSTRACT

A digital-to-analog converter (DAC) disposed in a data transmission path to convert data from a digital format to an analog format to be transmitted is powered down during a receive mode of operation for a wireless communication device. Likewise, an analog-to-digital converter (ADC) disposed in a data reception path to convert received data from an analog format to a digital format is powered down during a transmit mode of operation.

14 Claims, 5 Drawing Sheets

POWERING DOWN OF DAC AND ADC FOR RECEIVE/TRANSMIT MODES OF OPERATION IN A WIRELESS DEVICE

PRIORITY INFORMATION

This application is a continuation of and claims priority to U.S. patent application having an application Ser. No. 10/847,798; filed May 18, 2004 is now a U.S. Pat. No. 7,079,058; which application is hereby incorporated by reference.

BACKGROUND OF THE INVENTION

1. Technical Field of the Invention

The embodiments of the invention relate to wireless communication systems and, more particularly, to integrated circuits used in such wireless communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Generally, each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication device(s). For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For a wireless communication device to participate in wireless communications, it generally includes a built-in radio transceiver (i.e., receiver and transmitter) or is coupled to an associated radio transceiver (e.g., a station for in-home and/or in-building wireless communication networks, RF modem, etc.). As is known, the transmitter may include a data modulation stage, one or more intermediate frequency (IF) stages, and a power amplifier. The data modulation stage converts raw data into baseband signals in accordance with a particular wireless communication standard. The one or more intermediate frequency stages mix the baseband signals with one or more local oscillator signal(s) to produce RF signals. The power amplifier amplifies the RF signals prior to transmission via an antenna.

As is also known, the receiver is coupled to the antenna and may include a low noise amplifier, one or more intermediate frequency stages, a filtering stage, and a data recovery stage. The low noise amplifier receives inbound RF signals via the antenna and amplifies the signal. The one or more intermediate frequency stages mix the amplified RF signals with one or more local oscillator signal(s) to convert the amplified RF signal into baseband signals or IF signals. The filtering stage filters the baseband or IF signals to attenuate frequencies outside of the bandwidth of the filter to produce filtered signals. The data recovery stage recovers raw data from the filtered signals in accordance with the particular wireless communication standard employed.

Generally, in many wireless devices that operate from a battery, power consumption is a significant concern. Accordingly, employing various techniques to reduce power consumption in the operation of the device may extend its battery life. For example, low supply voltage chips may be utilized in the wireless device. Another method is to allow the display to become inactive after a time out period, if no user activity is noted. Still another technique is to place a processor in a sleep or suspend mode if activity is absent for a specified time period.

Accordingly, a need exists to continually find further techniques to reduce power consumption in a wireless device.

SUMMARY OF THE INVENTION

An apparatus and method to power down a digital-to-analog converter (DAC) and/or an analog-to-digital converter (ADC), depending on a mode of operation for a wireless device. The DAC is disposed in a data transmission path to convert data from a digital format to an analog format to be transmitted. The ADC is disposed in a data reception path to convert received data from an analog format to a digital format. A timing circuit is coupled to power down the ADC and power up the DAC when in a transmit mode of operation and to power up the ADC and power down the DAC when in a receive mode of operation.

In one embodiment, a SEND_FRAME signal, indicating data transmission and commencement of the transmit mode of operation for the device, is used to initiate the ADC power down and DAC power up. Similarly a second signal, indicating completion of data transmission, is used to initiate the ADC power up and DAC power down to return the device to the receive mode of operation.

In one embodiment, two counters are employed to set delays between the receiving of the SEND_FRAME signal and the initiation of the ADC power down and DAC power up, and receiving of the second signal and the initiation of the ADC power up and DAC power down. Still in another embodiment, a delay to power down the DAC is determined by a programmable value stored in a register.

DETAILED DESCRIPTION OF THE EMBODIMENTS OF THE INVENTION

Figure 1:
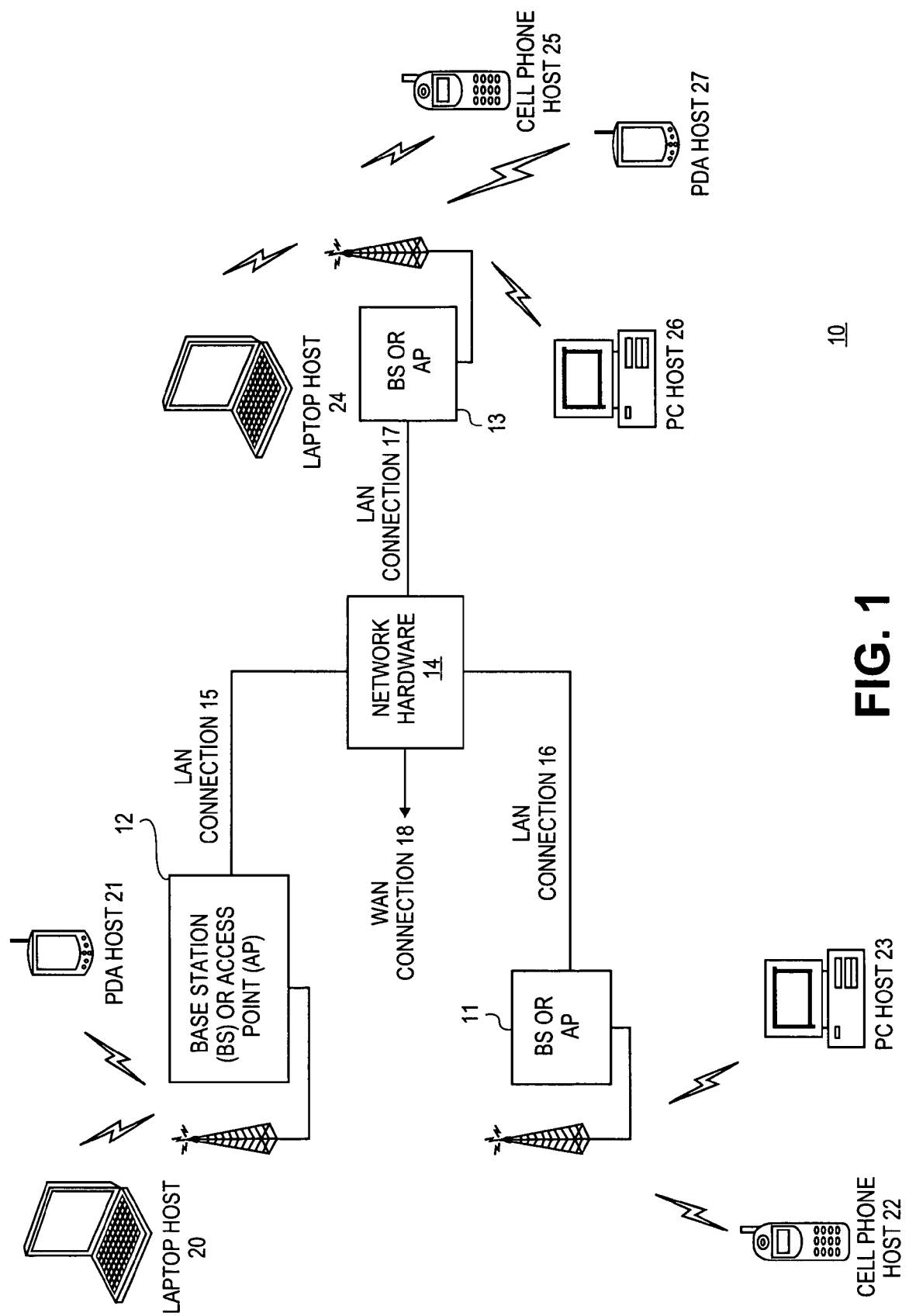
FIG. 1 is a system diagram showing a wireless communication system in which one or more devices may employ an embodiment of the present invention.

The embodiments of the present invention may be practiced in a variety of settings that implement conversion of a RF signal to send and/or receive data. FIG. 1 is a schematic block diagram illustrating a communication system 10 that includes a plurality of base stations (BS) and/or access points (AP) 11–13, a plurality of wireless communication devices 20–27 and a network hardware component 14. Wireless communication devices 20–27 may be laptop host computers 20, 24, personal digital assistant hosts 21, 27, personal computer hosts 23, 26 and/or cellular telephone hosts 22, 25. Communication system 10 may include other types of devices as well.

The base stations or access points (BS/AP) 11–13 may be operably coupled to network hardware 14 via respective local area network connections 15–17. Network hardware 14, which may be a router, switch, bridge, modem, system controller, etc., may provide a wide area network connection 18 for communication system 10. Individual BS/AP 11–13 generally has an associated antenna or antenna array to communicate with the various wireless communication devices in its area. Typically, the wireless communication devices register with a particular BS/AP 11–13 to receive services within communication system 10. For direct connections (i.e., point-to-point communications), wireless communication devices may communicate directly via an allocated channel.

Typically, base stations are used for cellular telephone systems and like-type systems, while access points are used for in-home or in-building wireless networks. Regardless of the particular type of communication system, an individual wireless communication device includes a built-in radio and/or is coupled to a radio. The radio may include a linear amplifier and/or programmable multi-stage amplifier to enhance performance, reduce costs, reduce size, and/or enhance broadband applications. It is to be noted that an embodiment of the invention may be implemented in one or more of the various units 11–13 and/or 20–27 of FIG. 1.

Figure 2:
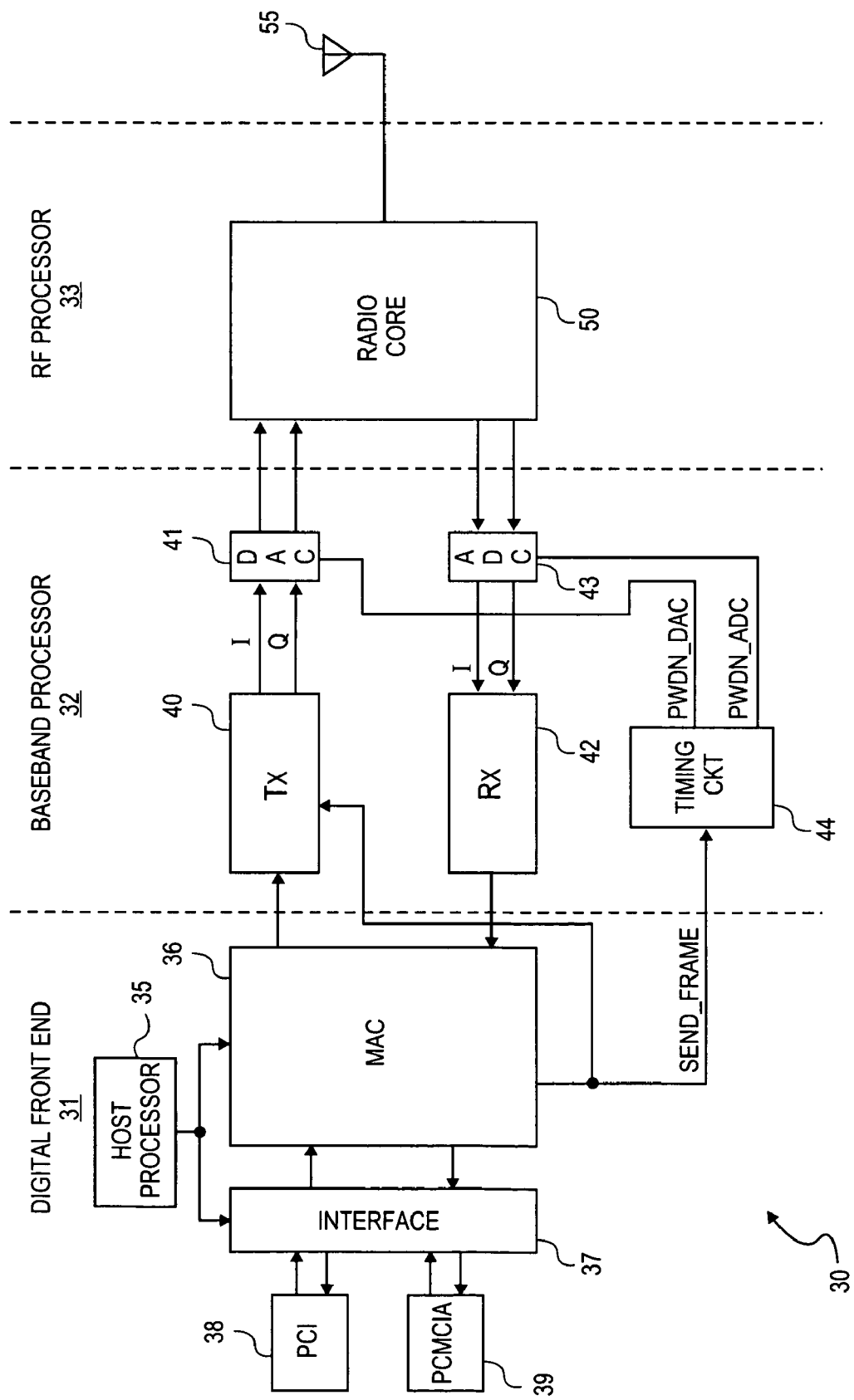
FIG. 2 is a block schematic diagram showing portions of a device utilized for wireless communication, in which an embodiment of the present invention is implemented in a baseband processor portion of the device.

FIG. 2 is a schematic block diagram illustrating an example embodiment of a device 30 that may be readily implemented in one or more of the wireless communication devices 20–27, as well as in BS/AP 11–13. Generally, for cellular telephone hosts, device 30 is a built-in component. For personal digital assistants hosts, laptop hosts, and/or personal computer hosts, device 30 may be built-in or may be an externally coupled component.

As shown in the embodiment of FIG. 2, device 30 includes a digital front end 31, baseband processor 32 and radio frequency (RF) processor 33. Digital front end 31 may be comprised of a variety of devices and circuits to process signals and interact with a user. Generally, a user inputs data through a keyboard, keypad, microphone, etc. and obtains data output through a visual display, speaker, headphone, etc. Data to be transmitted from device 30 is first processed by the digital front end 31 and sent as digital data to baseband processor 32. Likewise, in a receive mode, digital data output from baseband processor 32 is coupled to the digital front end 31 to be processed for use by the user.

In the example device 30, digital front end 31 includes a host processor 35, media access control (MAC) unit 36, interface 37 and one or more input/output (I/O) connections. In the particular example device 30, Peripheral Component Interconnect (PCI) connection 38 and Personal Computer Memory Card International Association (PCMCIA) connection 39 are shown as just two examples of the I/O interfaces available. It is to be noted that other connection and bus standards may be used to provide coupling to the interface 37.

The MAC unit 36 generally provides the node address(es) for various nodes on the network, if device 30 is coupled onto a network. A host processor 35 may be present to control the operation of the digital front end 31 and/or to process incoming and/or out-going data, if such data processing is needed prior to inputting data to the baseband processor 32 and/or outputting data to the user. Therefore, in a typical operation, data input from a user is received by the digital front end 31 and sent to baseband processor 32 when data is ready to be transmitted. Similarly, when data is received by wireless communication, the digital data output from the baseband processor 32 is coupled to the digital front end 31 to be made available for use by the user. It is to be noted that other embodiments for the digital front end may include additional components, such as memory, processing modules or other interfaces. Furthermore, the digital front end 31 may be part of a stand alone device, so that coupling to a network may not be needed. In other instances, the digital front end may perform corresponding communication functions in accordance with a particular standard, such as a cellular telephone standard.

Baseband processor 32 includes a transmitting (Tx) module 40 to receive digital data from the front end 31 and process the digital data for conversion as outbound signals to RF processor 33. Likewise, baseband processor 32 also includes a receiving (Rx) module 42 to receive inbound signals from the RF processor 33 and convert the inbound signals as digital data for output to the digital front end 31. In the particular embodiment shown for baseband processor 32, the Tx module 40 resides in the transmitting path and converts the digital signal from digital front end 31 to an in-phase component I and quadrature component Q pursuant to a known digital modulation technique. The outbound I and Q components are then coupled to a digital-to-analog converter (DAC) 41 to convert the digital component signals into analog signals. The Q and I analog components are then coupled to RF processor 33 as modulation signals. It is to be noted that DAC 41 may be comprised of one or more DAC units to provide the digital-to-analog conversion.

On the receiving path, the inbound RF signals are converted into Q and I components in RF processor 33 and coupled to an analog-to-digital converter (ADC) 43 for conversion to digital signals as part of demodulation. ADC 43 may be comprised of one or more ADC units to provide the analog-to-digital conversion. The digital Q and I components are then coupled to Rx module 42. Rx module 42 receives the Q and I digital components and combines the components to generate a digital signal for output to the digital front end 31.

It is to be noted that a variety of circuitry may be utilized for Tx and Rx modules to perform the Q and I component conversions, including circuitry known in the art. Furthermore, although not shown, other components may be resident in baseband processor 32, such as memory. What is to be noted is that the Tx module receives digital data from the digital front end and Q and I components are generated from the performed conversion in the Tx module. Likewise, in the receiving path, the Rx module receives the Q and I components and performs the conversion to generate a digital data output to the digital front end.

Baseband processor 32 may also include a timing circuit, such as timing circuit 44. Timing circuit 44 sends control signals to DAC 41 and ADC 43 to control activation and deactivation of these units 41, 43. The control signals are referred to as power down signals in this embodiment and the signals are designated as PWDN_DAC (Power Down DAC) and PWDN_ADC (Power Down ADC) to control the power down of DAC 41 and ADC 43, respectively. A state of the PWDN_DAC signal controls the power up or power down of DAC 41. Likewise, a state of the PWDN_ADC signal controls the power up or power down of ADC 43.

A SEND_FRAME signal, which is initiated by MAC 36, is coupled to Tx module 40 and timing circuit 44. The SEND_FRAME signal notifies to the Tx module that a frame of data is being sent from MAC 36 for transmission. The SEND_FRAME signal is sent to the timing circuit 44 to notify the timing circuit 44 that a transmission sequence is commencing and that DAC 41 should be in the power up state to allow for the coupling of data from Tx module 40 to RF processor 33. Generally, when data is being transmitted, DAC 41 is in the power up state and when data is being received, DAC 41 is in the power down state. Alternatively, when data is being transmitted, ADC 43 is in the power down state and when data is being received, ADC 43 is in the power up state. More detailed descriptions of the timing circuit 44 and the power up/down sequences of DAC 41 and ADC 43 are disclosed later in this disclosure.

RF processor 33 includes a radio core 50 for transmitting and receiving modulated RF signals. Radio core 50 receives the analog signal from baseband processor 32 and after filtering, uses the analog signal to modulate a signal envelope at a higher frequency, generally referred to as RF. A variety of modulation techniques may be employed, including modulation techniques known in the art. The baseband frequency may be converted directly to RF or one or more intermediate frequency (IF) conversion stage(s) may be employed. A typical technique is to employ a local oscillator and a mixer to perform the up-conversion operation to generate a modulated RF envelope. The RF signal is typically amplified and transmitted from an antenna 55.

Radio core 50 also receives RF signals through antenna 55 and employs a technique in reverse to demodulate a baseband signal from the received RF signal. Again, one or more IF conversion stages may be employed with a local oscillator, if direct conversion from RF to baseband frequency is not used. A low noise amplifier may be employed to amplify the received RF signal prior to demodulation. A variety of conversion techniques may be employed, including conversion techniques known in the art. The baseband components are then output to the baseband processor 32.

It is to be noted that various other components may be employed within radio core 50 to perform functions for modulation and demodulation. These components may include memory components, various filters (such as low-pass filters), low noise amplifiers to increase the gain of the received signal, power amplifiers to boost the power of the transmitted signal, local oscillators and mixers to perform the frequency conversion, as well as a switching controller at the antenna to switch between transmit and receive modes. Generally, a single antenna may be utilized. However, in other embodiments, separate antennae may be used for transmitting and receiving.

It is also to be noted that the Tx and Rx units 40, 42 of baseband processor 32 may also perform one or more operations including, constellation mapping/demapping, encoding/decoding, scrambling/unscrambling, as well as further frequency conversion. Generally, a particular wireless communication standard (e.g., IEEE 802.11 Bluetooth, etc.) is employed by the Tx and Rx units. The Tx and Rx units may be separate units or may employ shared units.

Furthermore, it is to be noted that device 30 of FIG. 2 may be implemented using one or more integrated circuits (ICs). For example, the digital front end may be implemented on one integrated circuit (IC), baseband processor 32 on another IC and RF processor 33 on still another IC. Alternatively, two of the units 31, 32, 33 or even all three of the units may be combined in the same IC. In some instances, external components (e.g., external memory) may be utilized in the operation of device 30.

For applications in which the device 30 operates in half-duplex mode, the radio core 50 either transmits data or receives data, but not both simultaneously. In the half-duplex mode, data is sent from the Tx unit 40 to radio core 50 in the transmit mode of operation or data is sent from the radio core 50 to Rx unit 42 in the receive mode of operation. In the transmit mode, DAC 41 is utilized, but not ADC 43. In the receive mode ADC 43 is utilized, but not DAC 41. Accordingly, in the transmit mode, DAC 41 is powered up and ADC 43 may be powered down. Similarly, in the receive mode, ADC 43 is powered up and DAC 41 may be powered down. It is to be noted that in the power up state, DAC 41 or ADC 43 operates in its active (on) mode of operation. However, in the power down state, DAC 41 or DAC 43 may operate in an inactive (off) mode, which reduces the power consumption of the particular powered down unit.

As noted in FIG. 2, the PWDN_DAC signal from timing circuit 44 controls the power up or power down state of DAC 41. Likewise, PWDN_ADC signal controls the power up or power down state of ADC 43. Two signals are employed in the particular example embodiment of FIG. 2 to allow separate control of DAC 41 and ADC 43. The use of separate control signals allows overlap in the power up/power down events sequence of the two units 41, 43. It is to be noted that in other embodiments, one control signal may be employed to power up one unit, while powering down the other unit. What is intended is to have ADC 43 in the power down state when data is being transmitted from Tx unit 40 to radio core 50 during the transmit mode and to have the DAC 41 in the power down state during the receive mode, when data is output from radio core 50 to Rx unit 42.

During those times that DAC 41 or ADC 43 is not in the active operational mode, that respective unit may be placed in the power down state. A power down state may take a variety of forms. Generally, what is intended during a power down state is to reduce the power consumption in the DAC 41 or ADC 43. Power down state may be achieved by reducing or removing a supply source (such as supply voltage), isolating the input, isolating the output, reducing the drive bias, inactivating the circuit, or any other mechanism available to reduce the power consumption in DAC 41 or ADC 43. In the power down state, less power is consumed by DAC 41 or ADC 43 than the amount of power typically consumed by the respective unit when it is active allowing data flow. Furthermore, it is to be noted that a variety of timing circuits may be implemented for timing circuit 44. In the embodiment of FIG. 2, timing circuit 44 is shown as part of baseband processor 32, but in other embodiments the timing circuit equivalent may be implemented elsewhere and control signals sent to baseband processor 32.

Figure 3:
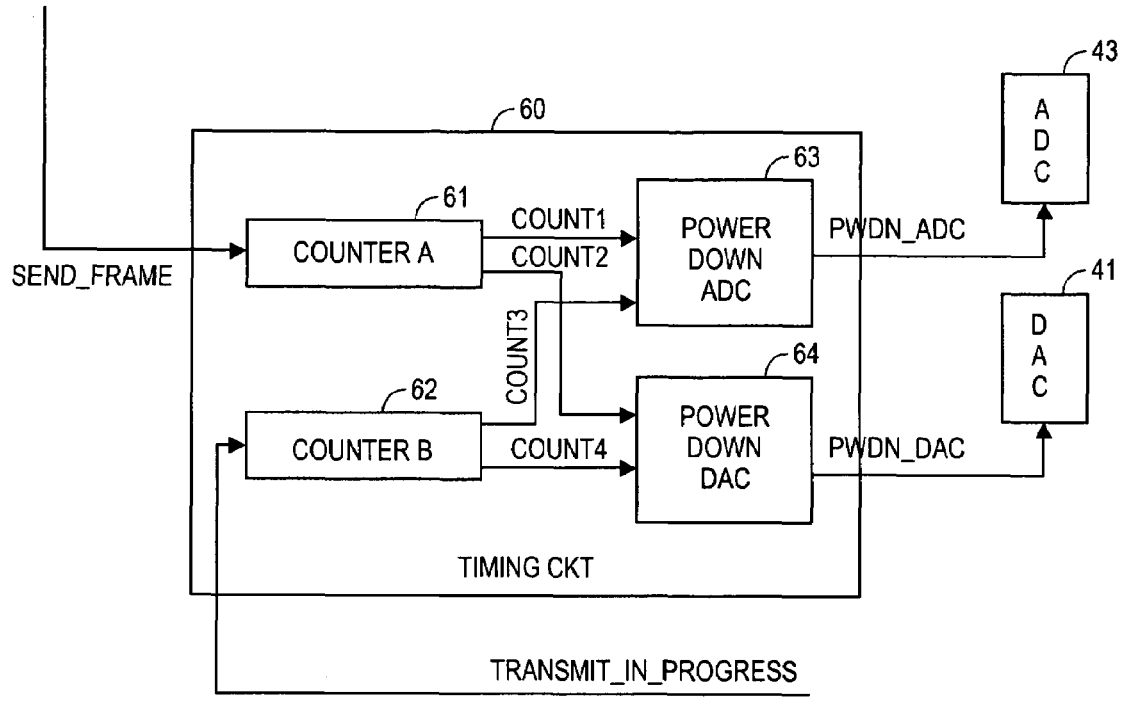
FIG. 3 is a block schematic diagram showing one embodiment for implementing the timing circuit of FIG. 2.
Figure 4:
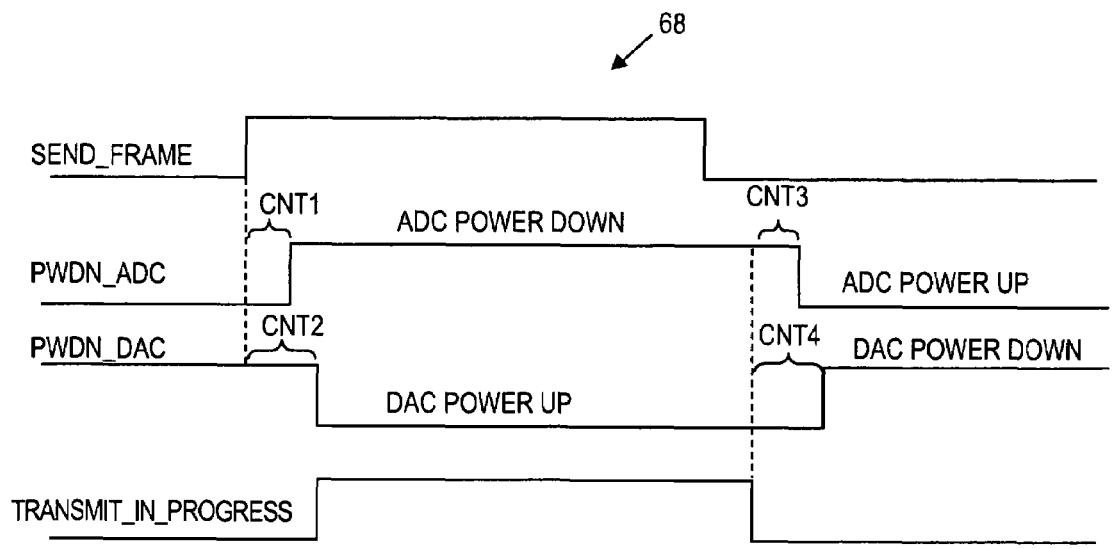
FIG. 4 is one embodiment of a timing diagram utilized with the circuit of FIG. 3.

A variety of timing schemes may be implemented to generate PWDN_ADC and PWDN_DAC. FIG. 3 illustrates one example embodiment for implementing the timing circuit 44 of FIG. 2. A timing circuit 60 is shown having two counters 61, 62 (also noted as counter A and counter B, respectively), power down ADC circuit 63 and power down DAC circuit 64. The SEND_FRAME signal is coupled to counter A. PWDN_ADC signal is generated by power down ADC circuit 63 and PWDN_DAC signal is generated by power down DAC circuit 64. In addition to these signals, a TRANSMIT_IN_PROGRESS signal is coupled to counter B. An example timing diagram 68 for the circuit 60 is shown in FIG. 4.

In the embodiment of FIG. 3, counter A generates two sets of counts noted as COUNT1 and COUNT2. Likewise, counter B also generates two sets of counts noted as COUNT3 and COUNT4. COUNT1 and COUNT3 signals are coupled to power down ADC circuit 63, while COUNT2 and COUNT4 signals are coupled to power down DAC circuit 64. As noted in timing diagram 68, counter A receives the SEND_FRAME signal and initiates a count cycle upon a state change of the SEND_FRAME signal. In the example, SEND_FRAME transitions high when a frame of data is to be sent for transmission. SEND_FRAME transitions low when the frame of data has been sent. In reference to device 30 of FIG. 2, SEND_FRAME transitions high when data is to be sent from MAC 36 to Tx unit 40 and SEND_FRAME transitions back to low when data transmission to the Tx unit 40 is complete.

Since the SEND_FRAME high-to-low signal transition identifies the completion of data transmission from the MAC 36 and not the completion of the data transmission out of the Tx unit 40 to the radio core 50, the TRANSMIT_IN_PROGRESS signal is utilized to designate when data transmission in the radio core is in progress and when data transmission has been completed. Since transmission from the Tx unit 40 to the radio core 50 is the modulation signal, the TRANSMIT_IN_PROGRESS signal indicates when the carrier is no longer modulated by the data from the Tx unit 40. Thus, as noted in diagram 68, the high-to-low transition of TRANSMIT_IN_PROGRESS may lag the high-to-low transition of SEND_FRAME. The TRANSMIT_IN_PROGRESS signal may be generated in the baseband processor 32 or the RF processor 33 in device 30 of FIG. 2.

Accordingly, upon receiving the low-to-high transition of SEND_FRAME, counter A initiates a start of a count cycle. Since the device was in a receive mode at the time, the initiation of the count cycle starts counter A to commence counting for two predetermined count (or delay) values noted as count1 and count2. When count1 is reached, COUNT1 signal state change to power down ADC circuit 63 activates the PWDN_ADC signal (low-to-high transition) to power down ADC 43. When count2 is reached, COUNT2 signal state change to power down DAC circuit 64 deactivates the PWDN_DAC (high-to-low transition) to power up DAC 41. Thus, when SEND-FRAME transition is received, the device enters into the transmit mode by powering down the ADC and powering up the DAC. Counter A may reset after the occurrence of count2.

The reverse condition of powering up the ADC and powering down the DAC to enter the receive mode is performed by counter B. When the TRANSMIT_IN_PROGRESS transitions (high-to-low in the example) to indicate that the frame of data has been transmitted, counter B initiates its count cycle to count for two predetermined count (or delay) values noted as count3 and count4. When count3 is reached, COUNT3 signal state change to power down ADC circuit 63 deactivates the PWDN_ADC (high-to-low transition) to power up ADC 43. When count 4 is reached, COUNT4 signal state change to power down DAC circuit 64 activates the PWDN_DAC (low-to-high transition) to power down DAC 41. Thus, when a TRANSMIT_IN_PROGRESS transition is received indicating the completion of the data transmission, the device enters into the receive mode by powering up the ADC and powering down the DAC. Counter B may reset after occurrence of count4.

In one embodiment for timing diagram 68, count 2 is assigned a count value which is equal to or greater than count1. This ensures that the receive side (ADC) is powered down prior or at the same time as powering up the transmit side (DAC). Likewise, count4 is assigned a count value which is equal to or greater than count3. This ensures that the receive side is powered up prior to or at the same time as powering down the transmit side.

In other embodiments, the count values count1, count2, count 3, count4 and/or combinations of count1, count2, count3 and/or count4, may have a value of "0", so that there is no delay. Still in other embodiments, count1 may be greater than count2 and count 3 may be greater than count 4.

Figure 5:
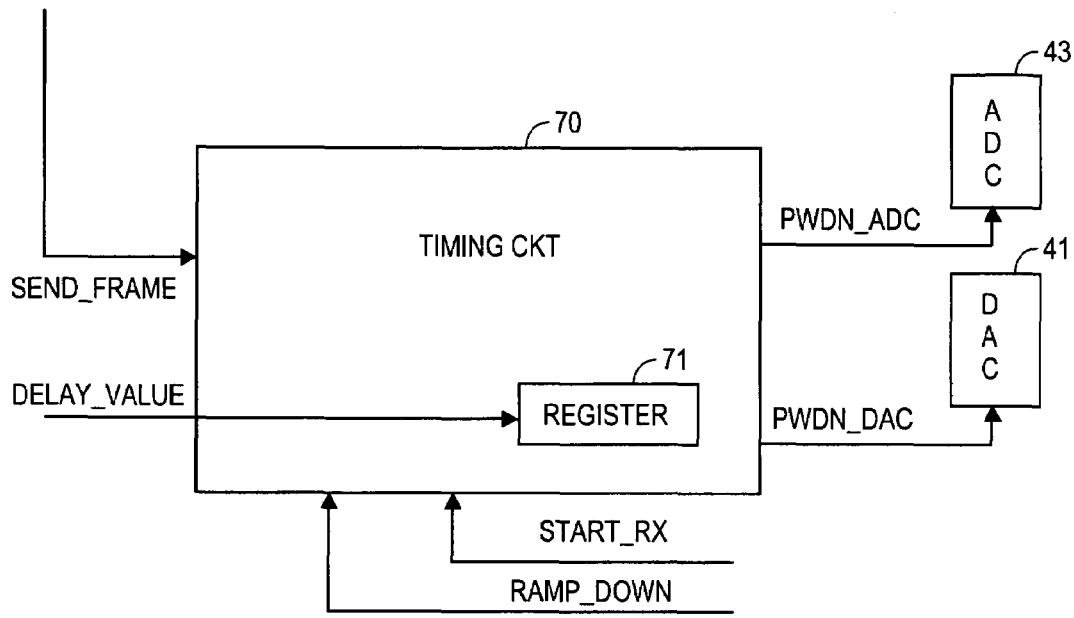
FIG. 5 is a block schematic diagram showing another embodiment for implementing the timing circuit of FIG. 2.

Accordingly, FIG. 5 illustrates another example embodiment for implementing timing circuit 44 of FIG. 2. A timing circuit 70 is used to generate both PWDN_ADC and PWDN_DAC signals to DAC 41 and ADC 43. Instead of employing four count values, a single delay is employed. A DELAY_VALUE is assigned and stored in a storage medium, such as a register 71. Register 71 is shown located within the timing circuit 70 in the embodiment of FIG. 5, however, the DELAY_VALUE may be stored elsewhere as well. As will be noted in the timing diagram shown in FIG. 6, the DELAY_VALUE is used to set the delay for powering down the DAC 41.

Two other signals may be utilized by timing circuit 70. A START_RX signal may be utilized to indicate when the receive mode is to commence. A RAMP_DOWN signal may be utilized to indicate when data transmission from the Tx unit has been completed. In this particular embodiment, RAMP_DOWN is used instead of a TRANSMIT_IN_PROGRESS. The RAMP_DOWN signal indicates the commencement of a ramp down sequence once data has been transmitted from the TX unit. Both START_RX and RAMP_DOWN signals may be generated in the baseband processor 32 or the RF processor 33 of device 30 of FIG. 2. In the particular embodiment, both signals are generated by the baseband processor 32.

Figure 6:
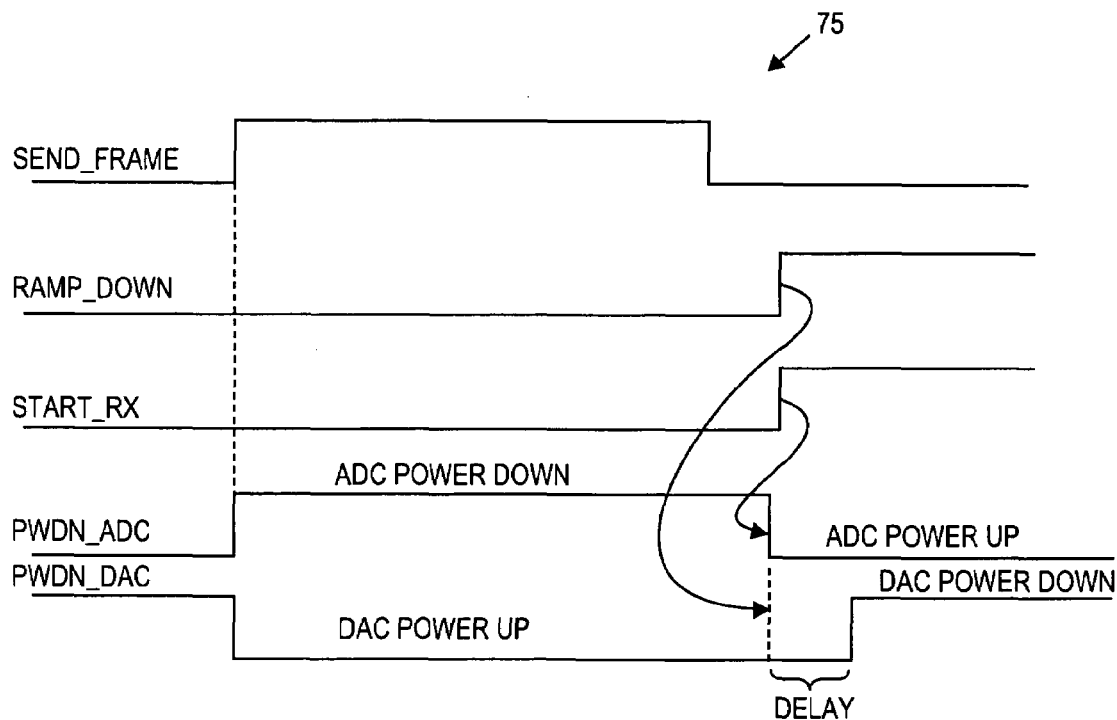
FIG. 6 is one embodiment of a timing diagram utilized with the circuit of FIG. 5.

FIG. 6 shows one embodiment of a timing diagram 75 for the timing circuit 70 of FIG. 5. A SEND_FRAME signal transition (low-to-high in the example) initiates activation (low-to-high transition) of PWDN_ADC to power down ADC 43, since the transmitting mode is to commence. The low-to-high transition of SEND_FRAME also initiates high-to-low transition of PWDN_DAC to power up DAC 41 for the transmitting mode. Predetermined delays of count1 and count2 of FIG. 4 are not implemented in timing diagram 75. When data transmission from MAC36 is complete, SEND_FRAME transitions low.

Some period of time after SEND_FRAME goes low, transmission from TX unit 40 to radio core 50 is completed and RAMP_DOWN signal transition from low to high, indicating that the transmission through DAC 41 is done. When RAMP_DOWN transitions high, this state change commences the delay period programmed into register 71. After the predetermined delay lapses, PWDN_DAC transitions low-to-high to power down the DAC, since it is no longer needed for transmission of data.

The START_RX signal is a separate control signal used to initiate the commencement of ADC power up. Thus, when START_RX transition low-to-high, PWDN_ADC transitions high-to-low to power up the ADC for the receiver side to be operational in the receive mode. In the shown embodiment of timing diagram 75, no delay is used for the ADC power up from START_RX. It is to be noted that other embodiments may use the RAMP_DOWN signal to also initiate the high-to-low transition of PWDN_ADC. However, by utilizing both RAMP_DOWN and START_RX, separate controls may be used for powering up the ADC and powering down the DAC.

It is to be noted that timing circuits of FIGS. 3 and 5 and timing diagrams of FIGS. 4 and 6 are just examples and that other timing circuits and schemes may be implemented to power up and power down DACs and ADCs. Furthermore, the particular triggering of events in the timing diagrams are also shown as examples and that other event triggering schemes may be implemented to practice the invention. Generally, what is intended is to power down the DAC during receive mode of operation and/or to power down the ADC during transmit mode of operation. It is also to be noted that various circuitry may be implemented, including circuits known in the art, to provide the timing sequence shown in FIGS. 4 and 6. In FIG. 5, timing circuit 70 uses a programmable register 71 to store a programmable DELAY_VALUE. It is to be noted that the count value(s) of counter A and/or counter B of timing circuit 60 of FIG. 3 may be made programmable as well in other embodiments.

Figure 7:
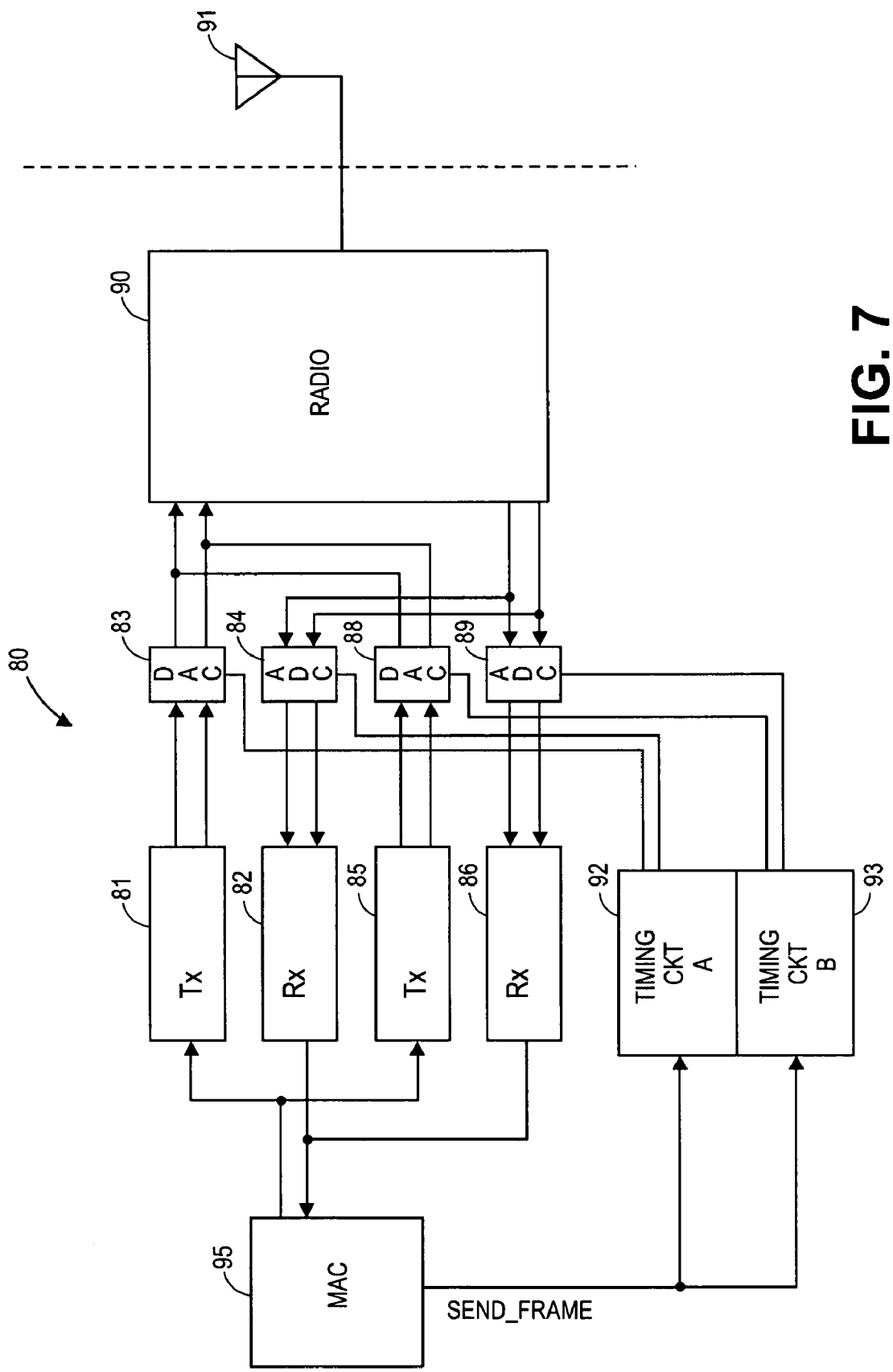
FIG. 7 is a block schematic diagram showing portions of a device utilized for wireless communication, in which another embodiment of the present invention is implemented using two timing circuits.

FIG. 7 shows another embodiment to practice the invention. In FIG. 7, two separate TX/RX combinations are implemented in a wireless processor 80. Although the components shown in FIG. 7 may be implemented in more than one integrated circuit, the particular wireless transceiver unit is implemented in a single integrated circuit (IC) 80. A Tx unit 81 and Rx unit 82 form a first Tx/Rx combination, along with corresponding DAC 83 and ADC 84. A second combination is formed by Tx unit 85 and Rx unit 86, along with corresponding DAC 88 and ADC 89. A single radio core 90 is used to which an external antenna 91 may be coupled.

A first timing circuit 92 (also noted as timing circuit A) is coupled to control power down/up of DAC 83 and ADC 84. A second timing circuit 93 (also noted as timing circuit B) is coupled to control power down/up of DAC 88 and ADC 89. A MAC 95 may be used at the front end and MAC 95 also generates the SEND_FRAME signal to the two timing circuits 92, 93.

In one embodiment for IC 80, timing circuit A implements timing circuit 60 of FIG. 3 and timing circuit B implements timing circuit 70 of FIG. 5. In this way, two different timing schemes may be employed in a single IC. Timing circuit A is utilized when units 81, 82, 83, 84 are made operational. Timing circuit B is utilized when units 85, 86, 88, 89 are made operational. Only one respective set of units are made operational at one time.

The dual Tx/Rx IC 80 allows different communication protocol schemes to be implemented. For example, timing circuit 60 may be used for one communication standard, while timing circuit 70 may be used for a second communication standard. In one embodiment, timing circuit 60 may be used for OFDM (Orthogonal Frequency Division Multiplexing) standard in the 5 GHz band (noted as a-mode), while timing circuit 70 may be used for OFDM standard or DSSS/CCK (Direct Sequence Spread Spectrum/Complementary Coded Keying) standard in the 2.4 GHz band (noted as g-mode). The corresponding Tx/Rx units would be designed for the respective communication standards. It is to be noted that this is but just one example and that other implementations are readily available for practicing the invention.

Thus, a scheme to power down a DAC and/or ADC in a wireless device is described. However, it is to be noted that the invention need not be limited to wireless devices and the invention may be readily adapted to other types of devices as well. In the various examples described in this disclosure, specific details have been provided, such as particular circuits and signal states. However, these are examples only and that other embodiments may be readily implemented to practice the invention.

We claim:

1. An apparatus comprising:
a baseband processor coupled to receive a digital signal from a digital front end, process the digital signal and convert the processed digital signal into an analog format for outbound radio transmission during a transmit mode of operation, the baseband processor also coupled to receive an analog signal obtained from inbound radio reception, convert the analog signal into a digital format and process the digital format of the analog signal for output to the digital front end during a receive mode of operation, the baseband processor including a digital-to-analog converter (DAC) to convert the processed digital signal into the analog format and an analog-to-digital converter (ADC) to convert the analog signal into the digital format, the baseband processor also including a timing circuit coupled to power down the ADC and power up the DAC during the transmit mode when a first signal from the digital front end indicates that a frame of data is to be sent from the digital front end for outbound transmission, but the timing circuit to power up the ADC and power down the DAC during the receive mode of operation when the outbound transmission is not present; and
a radio core coupled to the baseband processor to provide the outbound radio transmission during the transmit mode of operation and the inbound radio reception during the received mode of operation.

2. The apparatus of claim 1, wherein the first signal is a send frame signal.

3. The apparatus of claim 1, wherein the timing circuit is coupled to receive a second signal to indicate when outbound transmission to the radio core by the baseband processor has completed in order to initiate power down of the DAC and power up of the ADC to place the baseband processor into the receive mode of operation.

4. The apparatus of claim 3, wherein the timing circuit includes a first counter to set a first predetermined delay between receiving of the first signal and initiation of the power down of the ADC.

5. The apparatus of claim 4, wherein the first counter to set a second predetermined delay between receiving of the first signal and initiation of the power up of the DAC.

6. The apparatus of claim 5, wherein the timing circuit includes a second counter to set a third predetermined delay between receiving of the second signal and initiation of the power up of the ADC.

7. The apparatus of claim 6, wherein the second counter to set a fourth predetermined delay between receiving of the second signal and initiation of the power down of the DAC.

8. The apparatus of claim 1, wherein the timing circuit is coupled to receive a second signal to indicate when outbound transmission is completed in order to return to the receive mode of operation and in which the second signal is to be utilized to initiate power down of the DAC.

9. The apparatus of claim 8, wherein the timing circuit is coupled to receive a third signal to indicate when the receive mode of operation is to commence and in which the third signal is to be utilized to initiate power up of the ADC.

10. The apparatus of claim 8, wherein the timing circuit to store a delay value to set a predetermined delay between receiving of the second signal and initiation of the power down of the DAC.

11. The apparatus of claim 10, wherein the timing circuit includes a register to store the delay value.

12. The apparatus of claim 11, wherein the delay value is programmable.

13. A method comprising:
sending a first signal indicative of a frame of data being present for transfer to a baseband processor for outbound radio transmission;
powering up a digital-to-analog converter (DAC) disposed in an outbound data transmission path and powering down an analog-to-digital converter (ADC) disposed in an inbound data reception path to place the baseband processor into a transmit mode of operation to transmit data in response to the first signal;
transmitting the data for outbound transmission; and
powering down the DAC and powering up the ADC to place the baseband processor in a receive mode of operation when the transmit mode of operation has completed transmitting the data.

14. The method of claim 13, further including sending a second signal indicative of completion of the transmitting of the data to initiate the powering down of the DAC.

* * * * *